(12) United States Patent
Lee (10) Patent No.: US 7,566,614 B2
(45) Date of Patent: Jul. 28, 2009

(54) CAPACITOR OF SEMICONDUCTOR DEVICE AND METHOD OF FABRICATING THE SAME

(75) Inventor: Ki Min Lee, Cheongju-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 407 days.

(21) Appl. No.: 11/588,538

(22) Filed: Oct. 26, 2006

(65) Prior Publication Data
US 2007/0096192 A1    May 3, 2007

(30) Foreign Application Priority Data
Oct. 28, 2005    (KR) ...................... 10-2005-0102124

(51) Int. Cl.
*H01L 21/8242* (2006.01)
*H01L 21/20* (2006.01)

(52) U.S. Cl. ................. 438/243; 438/239; 438/253; 438/386; 438/387

(58) Field of Classification Search ........... 438/239, 438/243, 253, 386, 387
See application file for complete search history.

(56) References Cited

U.S. PATENT DOCUMENTS

| | | | | |
|---|---|---|---|---|
| 5,861,331 A | * | 1/1999 | Chien | 438/238 |
| 6,010,943 A | * | 1/2000 | Liao | 438/397 |
| 6,342,419 B1 | * | 1/2002 | Tu | 438/253 |
| 6,479,341 B1 | * | 11/2002 | Lu | 438/239 |
| 6,541,335 B2 | * | 4/2003 | Iwasa | 438/243 |
| 6,642,563 B2 | * | 11/2003 | Kanaya | 257/296 |
| 6,774,008 B1 | * | 8/2004 | Su et al. | 438/424 |

FOREIGN PATENT DOCUMENTS

KR    2000-0015040 A    3/2000

OTHER PUBLICATIONS

Kuo-Tai Huang, Wen-Yi Sie and Tri-Reong Yoo; "Capacitor of Semiconductor Device and Method of Fabricating the Same"; Korean Patent Abstracts; Publication No. 1020000015040 A; Publication Date: Mar. 15, 2000; Korean Intellectual Property Office, Republic of Korea.
Korean Office Action; Korean Patent Application No. 10-2005-0102124; Korean Intellectual Property Office, Republic of Korea.

* cited by examiner

*Primary Examiner*—Luan C Thai
(74) *Attorney, Agent, or Firm*—The Law Offices of Andrew D. Fortney; Andrew D. Fortney (57) ABSTRACT

Disclosed are a capacitor of a semiconductor device and a method of fabricating the same. The capacitor includes a capacitor top electrode, a capacitor bottom electrode aligned with a bottom surface and three lateral sides of the capacitor top electrode, and a capacitor insulating layer between the capacitor top electrode and the capacitor bottom electrode.

8 Claims, 7 Drawing Sheets

FIG. 1

(RELATED ART)

CAPACITOR OF SEMICONDUCTOR DEVICE AND METHOD OF FABRICATING THE SAME

BACKGROUND OF THE INVENTION

1. Field of the Invention

The present invention relates to a capacitor of a semiconductor device and a method of fabricating the same.

2. Description of the Related Art

A semiconductor integrated circuit includes active devices, such as diodes and transistors, and passive devices, such as capacitors, resistors and inductors.

Recently, studies and research are being pursued in the field of semiconductor devices in order to provide a method of fabricating passive devices as well as active devices. In particular, studies are being steadily performed in relation to a method of forming a capacitor or a resistor.

The capacitor reduces a level-shift voltage and stably maintains a voltage in the turn-off period of a thin film transistor. As the semiconductor devices become more highly integrated, high-capacity capacitors are also available.

In such a capacitor, an insulating layer is formed between top and bottom electrodes that face each other. In order to increase the capacitance of the capacitor, and thus obtain a high-capacity capacitor, it is preferable to enlarge the areas of the top and bottom electrodes of the capacitor while reducing the thickness of the insulating layer.

Hereinafter, a capacitor of a semiconductor device and a method of fabricating the same according to the related art will be described with reference to accompanying drawings.

Figure 1:
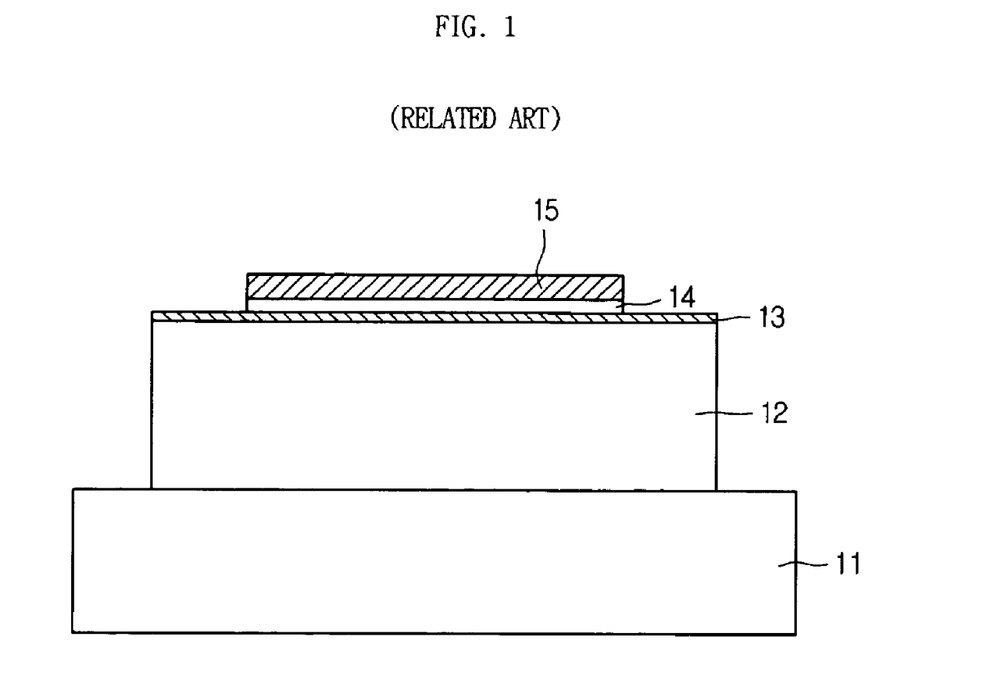
FIG. 1 is a sectional view illustrating a capacitor of a semiconductor device according to the related art.

FIG. 1 is a sectional view illustrating the capacitor of the semiconductor device according to the related art.

As shown in FIG. 1, capacitor bottom electrode layers 12 and 13 are formed on a semiconductor substrate 11 with predetermined thickness, and a low-dielectric insulating layer 14 is stacked on the capacitor bottom electrode 13. In addition, a capacitor top electrode 15 is formed on the low-dielectric insulating layer 14 such that the top electrode 15 faces the capacitor bottom electrodes 12 and 13.

Although doped polysilicon can be used to fabricate the capacitor top and bottom electrodes, metallic materials are generally used to fabricate high-capacity capacitors.

In order to form the capacitor having the above structure, a metallic material is deposited on the semiconductor substrate, and then the metallic material is patterned through a photolithography process, thereby forming the capacitor bottom electrode layers 12 and 13.

The capacitor bottom electrode layers 12 and 13 can be prepared in the form of a single layer or a dual layer. FIG. 1 shows the capacitor bottom electrode layers 12 and 13 having the dual layer structure.

In addition, the low-dielectric insulating layer 14 is formed on the entire surface of the resultant structure including the capacitor bottom electrode layers 12 and 13, and then the low-dielectric insulating layer 14 is patterned through an etching process. During the etching process for the low-dielectric insulating layer 14, the capacitor bottom electrode layers 12 and 13 can be at least partially etched together with the low-dielectric insulating layer 14. In this case, particles of the capacitor bottom electrode layers 12 and 13 may be re-deposited onto lateral sides of the insulating layer 14.

Finally, a metallic material is deposited on the entire surface of the resultant structure including the insulating layer 14, and then the metallic material is patterned through a photolithography process, thereby forming the capacitor top electrode 15. At this time, the patterning process for the capacitor top electrode 15 should not cause a short circuit between the capacitor top electrode 15 and the capacitor bottom electrode layers 12 and 13.

However, the capacitor of the semiconductor device and the method of fabricating the same according to the related art exhibit following problems.

First, although the area of the capacitor top and bottom electrodes must be enlarged in order to obtained the high-capacity capacitor, it may increase the area of the capacitor, so there are limitations in the integration capability of the capacitors in advanced processes for manufacturing semiconductor devices.

In addition, the thickness of the insulating layer must be reduced in order to obtain the high-capacity capacitor. However, in this case, the capacitor bottom electrode layers may also be etched during the etching process for the insulating layer, so that particles of the bottom electrodes may be re-deposited onto the lateral sides of the insulating layer. Such particles may cause the short circuit between the capacitor top electrode and the capacitor bottom electrodes in the process of forming the capacitor top electrode, and the likelihood of such a short circuit increases as the thickness of the insulating layer decreases.

Further, in the electrode structure of a conventional MIM (metal-insulator-metal) capacitor, fringe capacity may exist between the capacitor top electrode and the capacitor bottom electrodes. Such fringe capacity may degrade the capacitor characteristics.

SUMMARY OF THE INVENTION

The present invention has been made to solve the above problem occurring in the related art, and an object of the present invention is to provide a capacitor of a semiconductor device (or semiconductor integrated circuit), capable of improving capacity thereof by sufficiently utilizing a surface area of a capacitor bottom electrode.

Another object of the present invention is to provide a method of fabricating a capacitor of a semiconductor device, capable of preventing or reducing the likelihood of a short circuit between a capacitor top electrode and a capacitor bottom electrode.

In order to accomplish the above objects, according to one aspect of the present invention, there is provided a capacitor comprising: a capacitor top electrode; a capacitor bottom electrode aligned with a bottom surface and three lateral sides of the capacitor top electrode; and a capacitor insulating layer between the capacitor top electrode and the capacitor bottom electrode.

According to another aspect of the present invention, there is provided a capacitor comprising: a capacitor bottom electrode having a bottom section and lateral side sections on the bottom section (e.g., while being opened in a first direction); a capacitor insulating layer on the bottom section and the lateral side sections of the capacitor bottom electrode; and a capacitor top electrode in a cavity defined by the capacitor insulating layer (e.g., while extending in the first direction).

According to still another aspect of the present invention, there is provided a method for fabricating a capacitor, the method comprising the steps of: forming a dummy pattern on a semiconductor substrate; forming a dielectric layer on the semiconductor substrate including the dummy pattern; partially etching the dielectric layer to form an open area in the dielectric layer, and then removing the dummy pattern to form a first cavity; filling the first cavity and the open area with a first metallic material, thereby forming a capacitor bottom electrode; removing the dielectric layer on or in the capacitor bottom electrode to form a second cavity; and filling the second cavity with an insulating layer and a second metallic material, thereby forming a capacitor insulating layer and a capacitor top electrode.

DETAILED DESCRIPTION OF THE PREFERRED EMBODIMENTS

Hereinafter, a capacitor of a semiconductor device and a method of fabricating the same will be described with reference to accompanying drawings.

Figure 2:
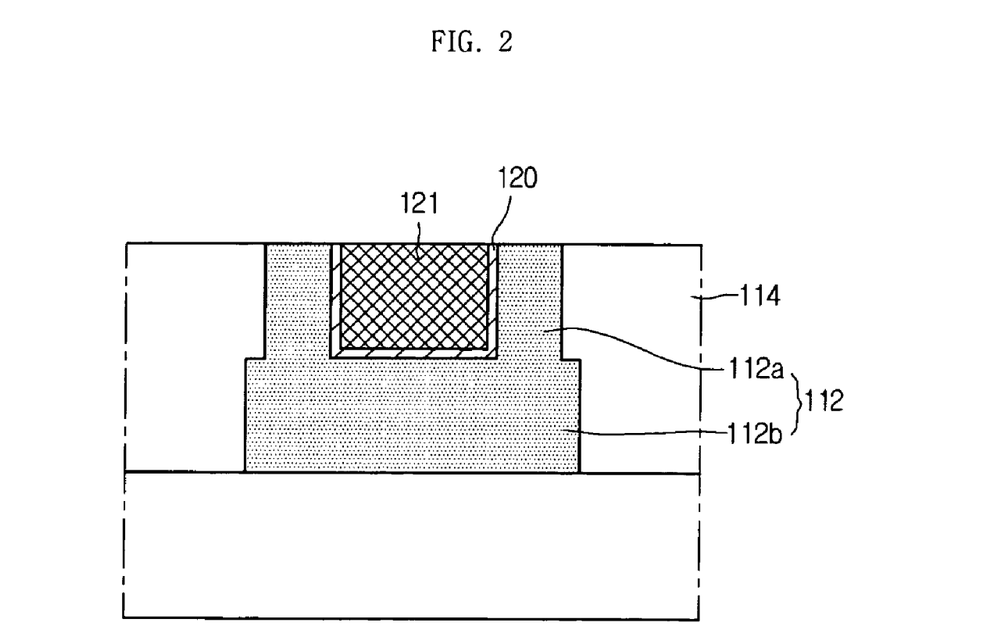
FIG. 2 is a sectional view illustrating a capacitor of a semiconductor device according to the present invention.

FIG. 2 is a sectional view illustrating an exemplary capacitor according to the present invention. FIGS. 3A to 3J are sectional views illustrating an exemplary procedure for fabricating a capacitor according to the present invention. FIG. 4 is a plan view for explaining the exemplary process for forming a capacitor according to the present invention.

As shown in FIG. 2, the capacitor according to the present invention includes a capacitor bottom electrode 112, a capacitor insulating layer 120, and a capacitor top electrode 121, which are sequentially formed on a semiconductor substrate 111 having an interlayer dielectric layer 114.

The capacitor bottom electrode 112 includes a first bottom electrode 112a, which is aligned with lateral sides of the capacitor top electrode 121 while surrounding three lateral sides of the capacitor top electrode 121, and a second bottom electrode 112b, which is aligned with the bottom surface of the capacitor top electrode 121 and has a hexahedral (e.g., substantially six-sided) or "U" shape.

FIG. 2 shows a cross section of the capacitor. When the capacitor is viewed in a plan view, the second bottom electrode 112b has one or more dimensions and/or an area larger than that of the first bottom electrode 112a. Thus, as shown in FIG. 2, the first bottom electrode 112a and the interlayer dielectric layer 114 (in part) are formed on the second bottom electrode 112b.

The capacitor top electrode 121 is filled in the capacitor bottom electrode 112 with the capacitor insulating layer 120 therebetween.

In this manner, the capacitor bottom electrode 112 has a three-dimensional topology, such that the surface area of the capacitor bottom electrode 112 facing the capacitor top electrode 121 can be enlarged, thereby increasing capacity of the capacitor while reducing the two-dimensional area of the capacitor in a top-down view (e.g., as shown in FIG. 4). Thus, it is possible to highly integrate the semiconductor device.

The capacitor bottom electrode 112 includes one or more members selected from the group consisting of Al, W, Cu, TiN and TaN, the capacitor insulating layer 120 includes one or more members selected from the group consisting of $TaO_2$, $Al_2O_3$, and SiN, and the capacitor top electrode 121 includes one or more members selected from the group consisting of Ru, Pt, TiN, TaN and Al. Preferably, the capacitor bottom electrode 112 includes either one member selected from the group consisting of TiN and TaN, or one member selected from the group consisting of Al, W and Cu, along with a conventional liner layer therefor (e.g., a Ti/TiN bilayer in the case of Al or W, or a Ta/TaN bilayer in the case of Cu).

Hereinafter, the method of fabricating the capacitor will be described in detail with reference to FIGS. 3A to 3J.

Figure 3A:
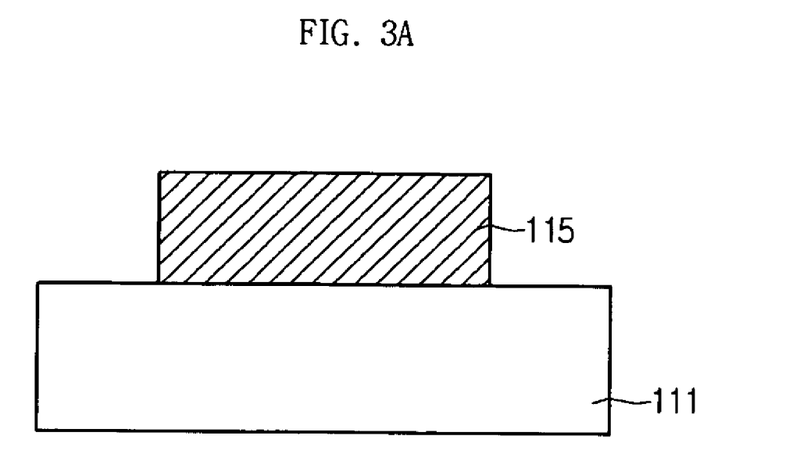
FIGS. 3A to 3J are sectional views illustrating the procedure for fabricating a capacitor of a semiconductor device according to the present invention.
Figure 4:
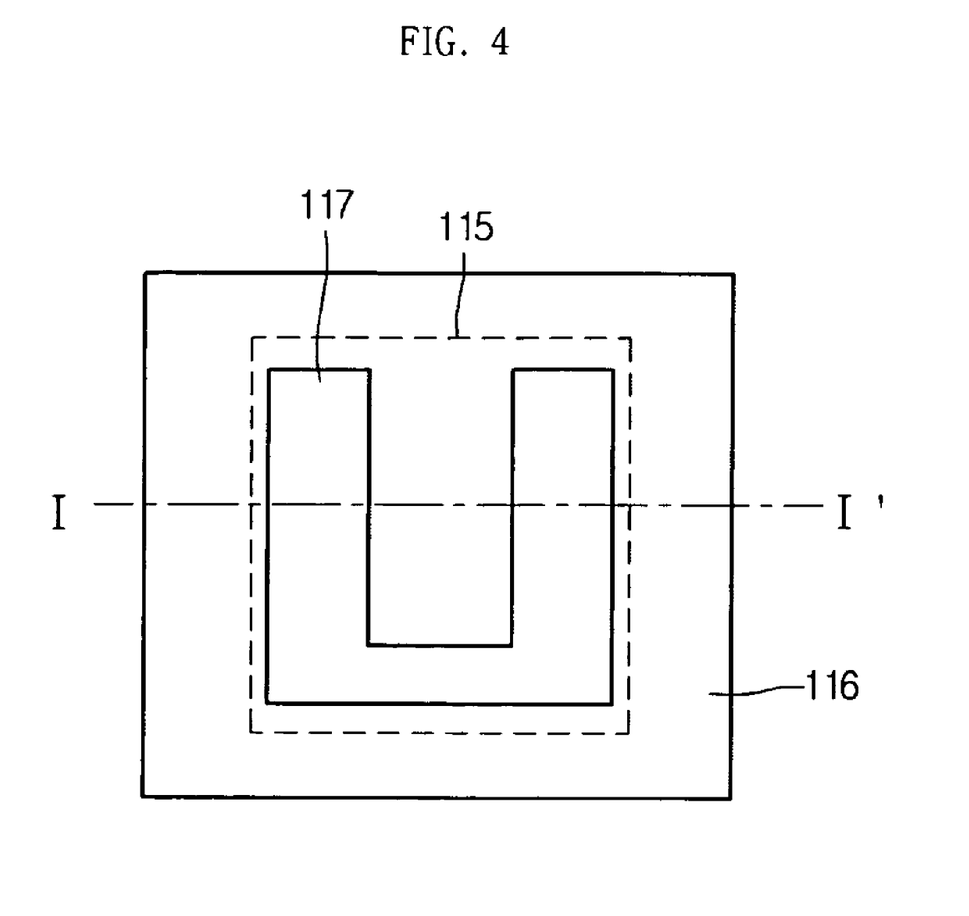
FIG. 4 is a plan view for explaining a process for forming a capacitor of a semiconductor device according to the present invention.

First, as shown in FIG. 3A, polyimide or silicon nitride (SiN) is deposited on the semiconductor substrate 111, and then it is patterned through a photolithography process, thereby forming a dummy pattern 115 having a predetermined thickness. Alternatively, the dummy pattern 115 may be replaced by the second bottom electrode layer 112b when the second bottom electrode layer 112b comprises a material or materials that do not introduce an unacceptable risk of particle generation during subsequent dielectric layer etching.

In general, the semiconductor substrate 111 includes a silicon wafer substrate. However, the semiconductor substrate 111 can be prepared as a material layer including a specific conductive layer therein (e.g., an epitaxial silicon or SiGe layer). In this case, the conductive layer may include an impurity doping area formed on the semiconductor substrate, or may include a copper interconnection layer or other conductive patterns.

Figure 3B:
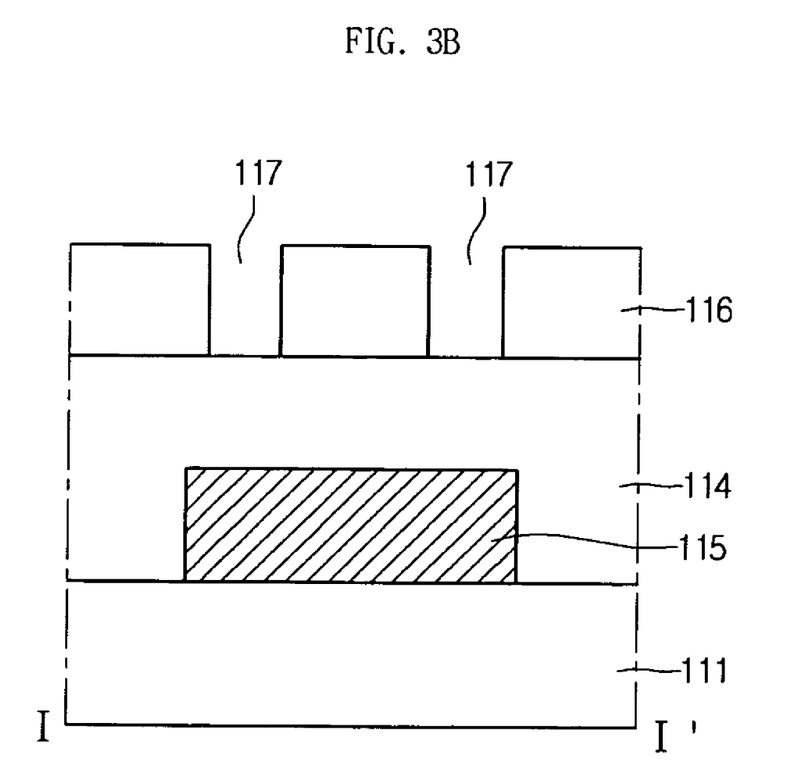

Then, as shown in FIG. 3B, the interlayer dielectric layer 114 is formed on the entire surface of the semiconductor substrate 111 including the dummy pattern 115. Dielectric layer 114 generally has a thickness substantially greater than that of the dummy pattern 115 (e.g., by at least 1000 Å, 2000 Å, 3000 Å or more). The interlayer dielectric layer 114 preferably includes a low-dielectric insulating layer, such as a porous silicon oxide layer, a PSG (phosphorous silicate glass) layer, a BPSG (boron phosphorous silicate glass) layer, a USG (undoped silicate glass) layer, an FSG (fluorine doped silicate glass) layer, an SIOC layer, an HDP (high density plasma) layer, a PE-TEOS (plasma enhanced-tetra ethyl ortho silicate) layer, or an SOG (spin on glass) layer.

After that, first photoresist 116 is deposited on the interlayer dielectric layer 114. Then, the exposure and development process is performed with respect to the first photoresist 116, thereby forming a first open area 117 as shown in FIG. 4. At this time, the first open area 117 is formed above the dummy pattern 115 while being opened or exposed in the first direction (e.g., towards an upper surface) when viewed in a plan view.

The dummy pattern 115 corresponds to an area where the second bottom electrode 112b is formed, and the interlayer dielectric layer 114 exposed by the first open area 117 corresponds to an area where the first bottom electrode 112a is formed, which will be described later in detail.

Figure 3C:
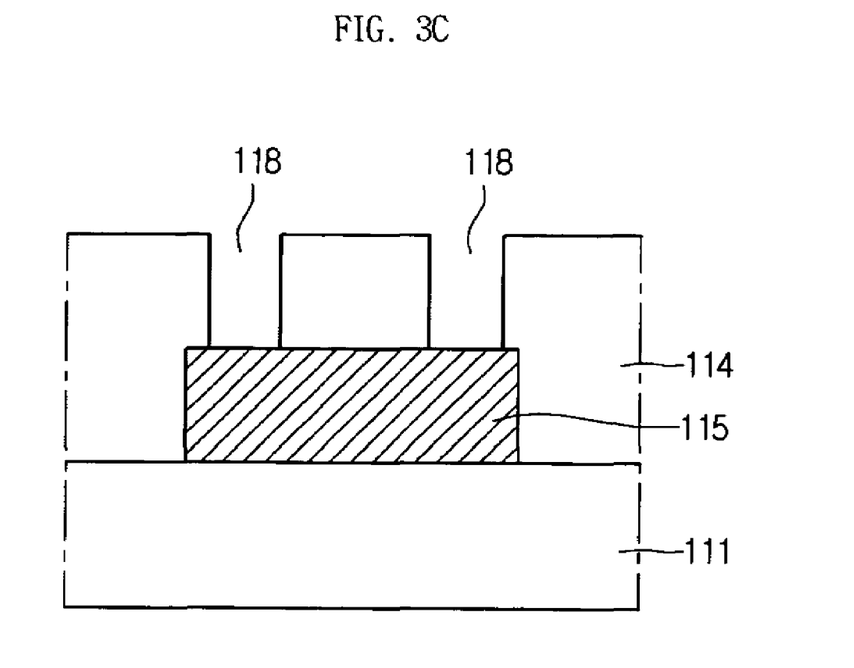

As shown in FIG. 3C, the interlayer dielectric layer 114 is etched using the patterned first photoresist 116 as an etch mask, so that a second open area 118, which corresponds to and/or is substantially identical to the first open area 117 formed in the first photoresist 116, is formed in the interlayer dielectric layer 114, thereby exposing the dummy pattern 115 to the exterior. Then, the first photoresist 116 is completely removed through an ashing process.

When the interlayer dielectric layer 114 is etched, the dummy pattern 115 serves as an etch stop layer. Thus, the dummy pattern 115 can also be replaced with a suitable material for the second bottom electrode in the case where the etch rate of the material is significantly less than the etch rate of the dielectric layer 114 when the dielectric layer 114 is etched. Accordingly, the area of the second bottom electrode 112b corresponding to the dummy pattern 115 is larger than the area of the first bottom electrode 112a corresponding to the second open area 118 (see, e.g., FIG. 4).

Figure 3D:
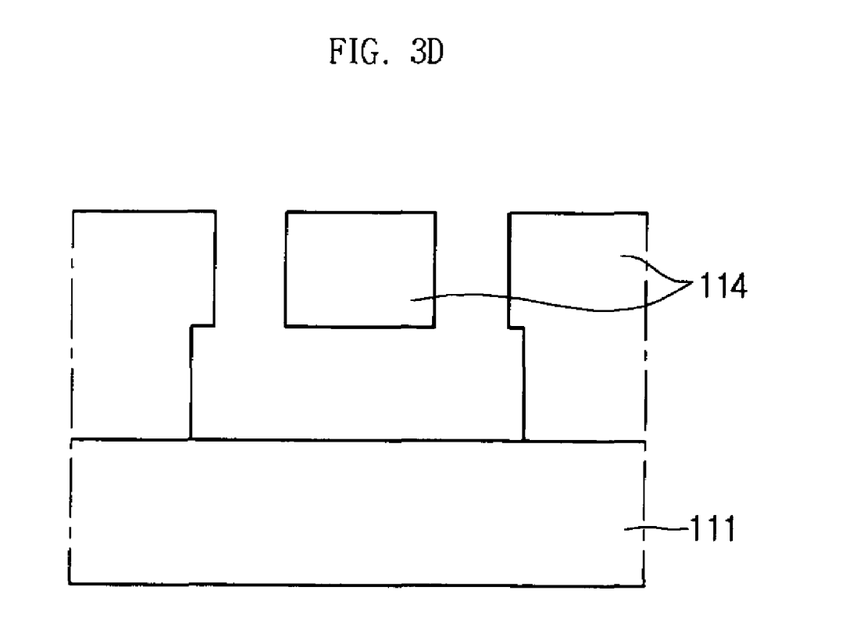

Then, as shown in FIG. 3D, when the dummy pattern 115 comprises a non-conductive material, the dummy pattern 115 is completely removed through the second open area 118, so that a cavity is formed in place of the dummy pattern 115. At this time, if the dummy pattern 115 includes polyimide, the dummy pattern 115 can be removed by means of oxygen ($O_2$) plasma (e.g., by etching in the presence of a plasma formed from or comprising dioxygen). In addition, if the dummy pattern 115 includes silicon nitride (SiN), the dummy pattern 115 can be removed by wet etching using $H_3PO_4$ (e.g., with aqueous phosphoric acid).

Figure 3E:
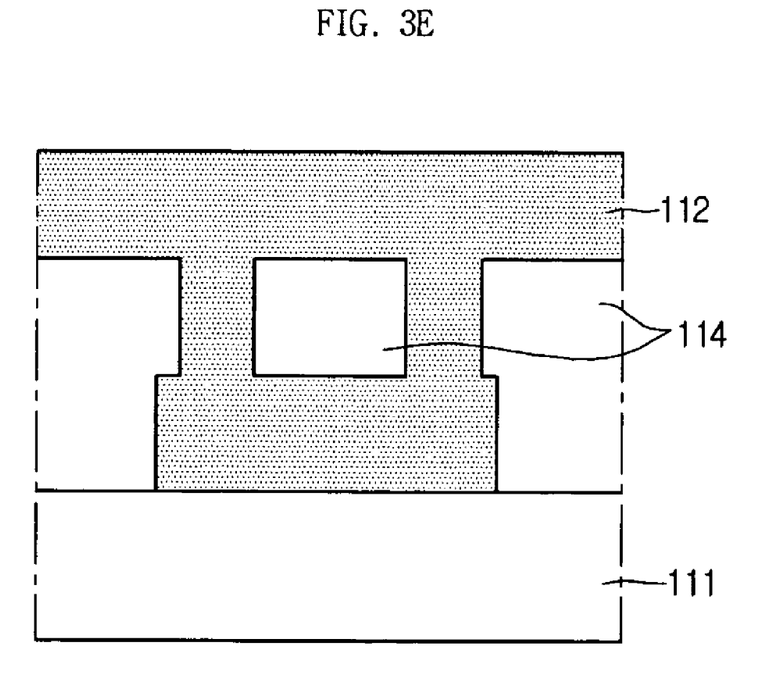

After that, as shown in FIG. 3E, a first metallic material, which includes one or more members selected from the group consisting of Al, W, Cu, TiN and TaN (preferably one bulk material selected from the group, and in the case of Al, W or Cu, optionally a liner material such as TiN or TaN, which may further include an adhesive material such as Ti or Ta on the sidewalls of the cavity), is deposited on the entire surface of the semiconductor substrate 111 in such a manner that the cavity formed from removal of the dummy pattern 115, and the second open area 118 are filled with the first metallic material, thereby forming the capacitor bottom electrode 112. Such cavity filling is generally performed by chemical vapor deposition (CVD), but appropriate conditions for physical vapor deposition (PVD or sputtering) of the first metallic material can be determined by one skilled in the art. Of course, when the dummy pattern 115 is replaced with a material for the second bottom electrode 112b, the first metallic material fills only the second open area 118.

Figure 3F:
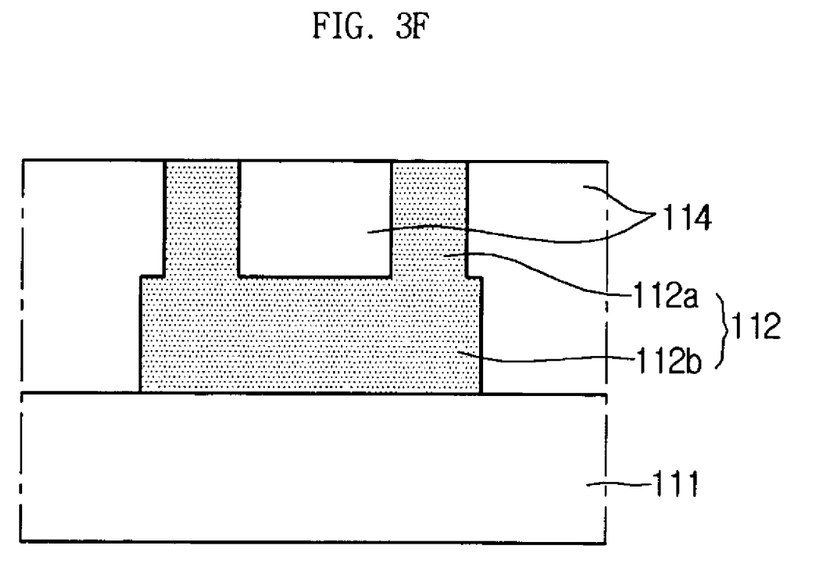

Then, the entire surface of the semiconductor substrate 111 is planarized through a CMP (chemical mechanical polishing) process, thereby obtaining the capacitor bottom electrode 112 as shown in FIG. 3F. At this time, the surface of the interlayer dielectric layer 114 may serve as an end-point of the CMP process.

In this manner, the capacitor bottom electrode 112 having a three-dimensional topology, in which a recess is formed at the center of the capacitor bottom electrode 112 when viewed in a plan view or a sectional view, can be obtained through the damascene process.

Figure 3G:
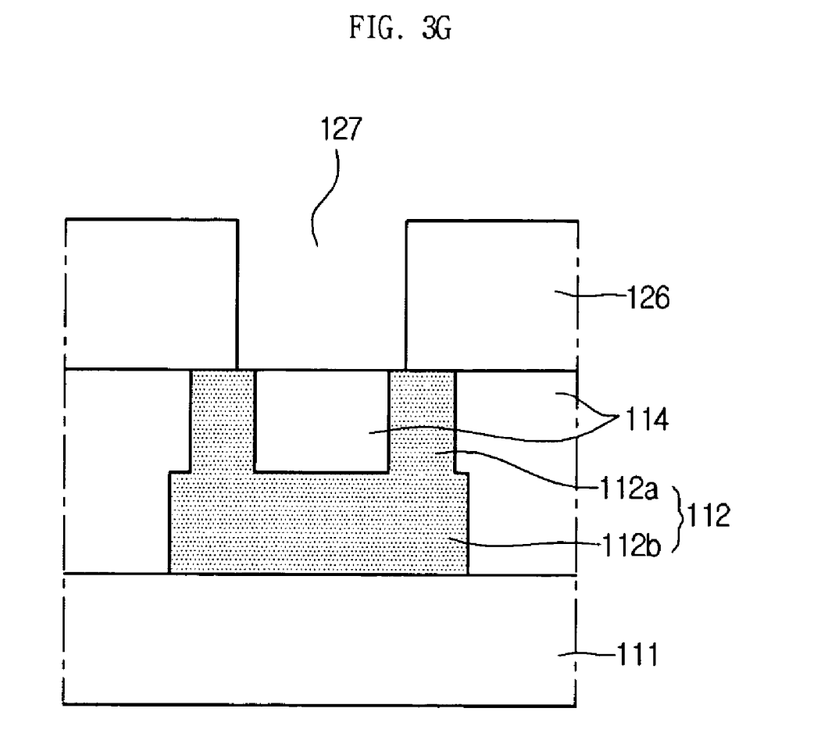

After that, as shown in FIG. 3G, second photoresist 126 is coated on the interlayer dielectric layer 114 formed with the capacitor bottom electrode 112, and the photolithography process is performed with respect to the second photoresist 126, thereby forming a third open area 127 in the second photoresist 126. The interlayer dielectric layer 114 corresponding to the recess area of the capacitor bottom electrode 112 is exposed to the exterior through the third open area 127.

Figure 3H:
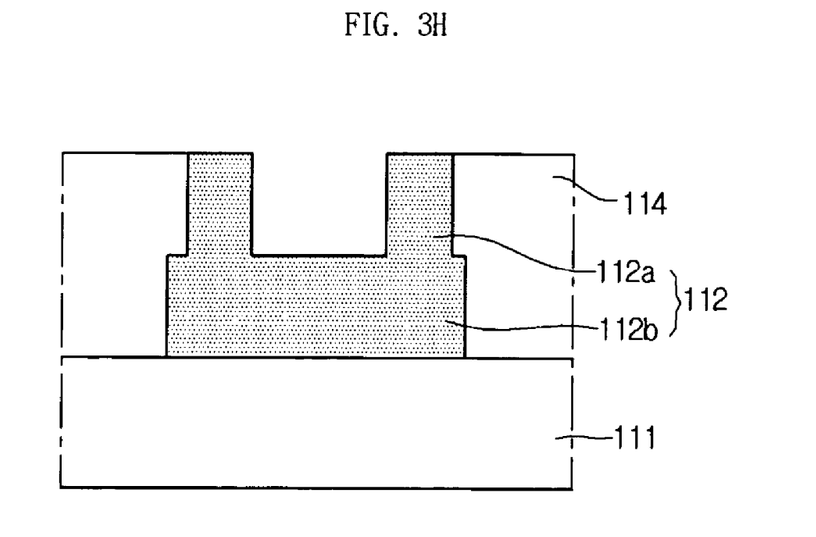

Then, as shown in FIG. 3H, the interlayer dielectric layer 114 exposed through the third open area 127 of the second photoresist 126 is removed, generally by conventional wet or dry etching. The capacitor bottom electrode 112 may serve as an end-point when removing the interlayer dielectric layer 114.

Figure 3I:
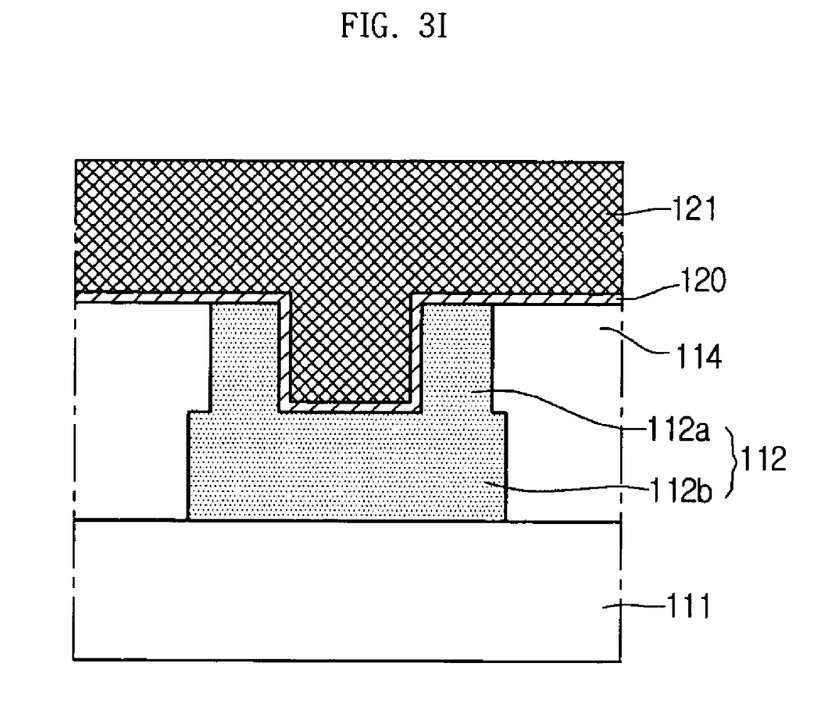

After that, as shown in FIG. 3I, an insulating material, which includes any one selected from the group consisting of $TaO_2$, $Al_2O_3$ and SiN, is deposited (e.g., by CVD of the materials themselves, or sputtering of the corresponding metal and conventional conversion to the corresponding oxide or nitride) on the entire surface of the semiconductor substrate 111 including the capacitor bottom electrode 112, thereby forming the capacitor insulating layer 120. Then, a second metallic material, which includes one selected from the group consisting of Ru, Pt, TiN, TaN and Al, is deposited on the capacitor insulating layer 120 (e.g., by blanket deposition, sufficiently to fill the trench or cavity in the capacitor bottom electrode 112), thereby forming the capacitor top electrode 121.

Figure 3J:
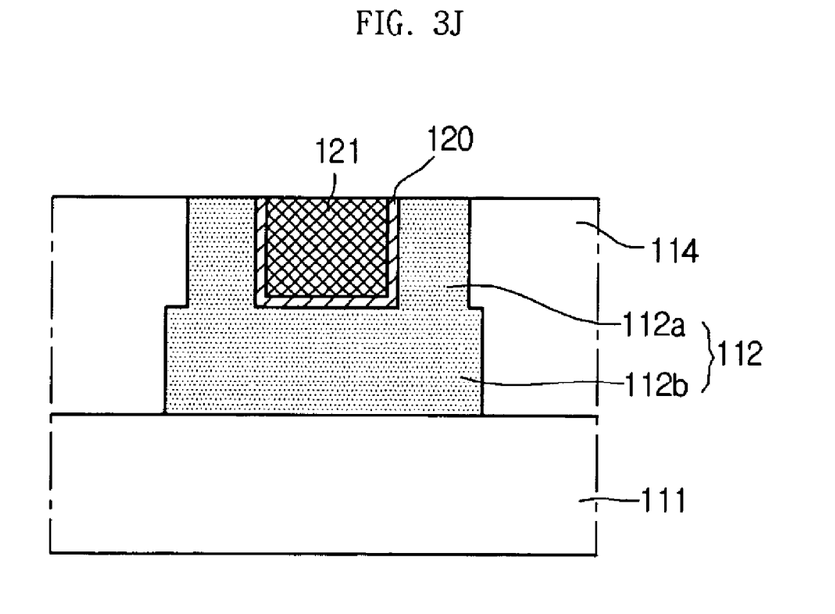

Then, the capacitor insulating layer 120 and the capacitor top electrode 121 are planarized through a CMP (chemical mechanical polishing) process, thereby obtaining the capacitor insulating layer 120 and the capacitor top electrode 121 as shown in FIG. 3J. At this time, the surface of the interlayer dielectric layer 114 may again serve as an end-point of the CMP process.

In this manner, the capacitor bottom electrode 112, the capacitor insulating layer 120, and the capacitor top electrode 121 are formed through the damascene process, thereby obtaining the capacitor.

The capacitor of the semiconductor device and the method of fabricating the same according to the present invention have the following advantages.

First, since the capacitor top and bottom electrodes have a three-dimensional topology, instead of a conventional plate or to-dimensional topology, the surface area of the capacitor bottom electrode that faces the capacitor top electrode can be increased per unit area of the integrated circuit. Accordingly, the capacity of the capacitor can be increased proportionally to the upper surface area of the capacitor top and bottom electrode.

Second, since the occupying area of the capacitor is reduced, the semiconductor devices can be highly integrated.

Third, since the capacitor electrodes are fabricated through the damascene process, it is possible to prevent or reduce the incidence of short circuits between the capacitor top and bottom electrodes.

It will be apparent to those skilled in the art that various modifications and variations can be made in the present invention. Thus, it is intended that the present invention covers the modifications and variations thereof within the scope of the appended claims.

What is claimed is:

1. A method for fabricating a capacitor, the method comprising the steps of:
    forming a dummy pattern on a semiconductor substrate;
    forming a dielectric layer on the semiconductor substrate including the dummy pattern;
    partially etching the dielectric layer to form an open area in the dielectric layer, and then removing the dummy pattern to form a first cavity;
    filling the first cavity and an open area in the dielectric layer with a first metallic material, thereby forming a capacitor bottom electrode;
    removing the dielectric layer in the capacitor bottom electrode to form a second cavity; and
    filling the second cavity with an insulating layer and a second metallic material, thereby forming a capacitor insulating layer and a capacitor top electrode.

2. The method as claimed in claim 1, wherein the dielectric layer is partially etched such that an upper portion of the dummy pattern is partially exposed.

3. The method as claimed in claim 1, wherein the dummy pattern functions as an etch stop layer when partially etching the dielectric layer.

4. The method as claimed in claim 1, wherein the dummy pattern includes polyimide, and removing the dummy pattern comprises etching the dummy pattern with an oxygen ($O_2$) plasma.

5. The method as claimed in claim 1, wherein the dummy pattern includes silicon nitride, and removing the dummy pattern comprises wet etching the dummy pattern with aqueous $H_3PO_4$.

6. The method as claimed in claim 1, wherein the capacitor bottom electrode includes a member selected from the group consisting of Al, W, Cu, TiN and TaN.

7. The method as claimed in claim 1, wherein the capacitor insulating layer includes a member selected from the group consisting of $TaO_2$, $Al_2O_3$, and SiN.

8. The method as claimed in claim 1, wherein the capacitor top electrode includes a member selected from the group consisting of Ru, Pt, TiN, TaN and Al.

* * * * *